United States Patent
Modak et al.

(10) Patent No.: US 11,557,874 B2
(45) Date of Patent: Jan. 17, 2023

(54) DOUBLE-SIDED COOLING OF LASER DIODES

(71) Applicant: Trumpf Photonics, Inc., Cranbury, NJ (US)

(72) Inventors: Prasanta Modak, East Windsor, NJ (US); Stefan Heinemann, Hightstown, NJ (US); Berthold Schmidt, Stuttgart (DE)

(73) Assignee: Trumpf Photonics, Inc., Cranbury, NJ (US)

( * ) Notice: Subject to any disclaimer, the term of this patent is extended or adjusted under 35 U.S.C. 154(b) by 44 days.

(21) Appl. No.: 17/323,328

(22) Filed: May 18, 2021

(65) Prior Publication Data

US 2022/0376467 A1  Nov. 24, 2022

(51) Int. Cl.

| H01S 5/40 | (2006.01) |
| H01S 5/024 | (2006.01) |
| H01S 5/023 | (2021.01) |
| H01S 5/042 | (2006.01) |
| H01S 5/0234 | (2021.01) |

(52) U.S. Cl.
CPC .......... *H01S 5/02407* (2013.01); *H01S 5/023* (2021.01); *H01S 5/02492* (2013.01); *H01S 5/0422* (2013.01); *H01S 5/4018* (2013.01); *H01S 5/4043* (2013.01); *H01S 5/0234* (2021.01)

(58) Field of Classification Search
CPC ....... H01S 5/4018; H01S 5/024–02423; H01S 5/02469–02492; H01S 5/023–02326; H01S 5/4037
See application file for complete search history.

(56) References Cited

U.S. PATENT DOCUMENTS

| 4,338,577 | A |   | 7/1982 | Sato et al. |
| 4,393,393 | A | * | 7/1983 | Allen, Jr. ............ H01S 5/02423 257/714 |
| 5,105,430 | A |   | 4/1992 | Mundinger et al. |
| 5,337,328 | A | * | 8/1994 | Lang ...................... H01S 5/423 372/45.01 |
| 5,606,181 | A |   | 2/1997 | Sakuma et al. |
| 5,835,515 | A | * | 11/1998 | Huang ................. G02B 6/4272 372/75 |
| 5,887,012 | A | * | 3/1999 | Yamada ............... H01S 5/4031 372/50.12 |

(Continued)

FOREIGN PATENT DOCUMENTS

| DE | 10229712 | 1/2004 |
| DE | 102018210142 A1 * | 12/2019 ......... H01S 5/02355 |

(Continued)

*Primary Examiner* — Tod T Van Roy
(74) *Attorney, Agent, or Firm* — Fish & Richardson P.C.

(57) ABSTRACT

Methods, devices, and systems for double-sided cooling of laser diodes are provided. In one aspect, a laser diode assembly includes a first heat sink, a plurality of submounts spaced apart from one another on the first heat sink, a plurality of laser diodes, and a second heat sink on top sides of the plurality of laser diodes. Each laser diode includes a corresponding active layer between a first-type doped semiconductor layer and a second-type doped semiconductor layer. A bottom side of each laser diode is positioned on a different corresponding submount of the plurality of submounts. The plurality of laser diode are electrically connected in series.

18 Claims, 7 Drawing Sheets

(56) References Cited

U.S. PATENT DOCUMENTS

| | | | | |
|---|---|---|---|---|
| 5,985,684 A | * | 11/1999 | Marshall | H01S 5/02476 438/118 |
| 6,211,511 B1 | * | 4/2001 | Shih | G11B 7/1353 |
| 6,240,116 B1 | * | 5/2001 | Lang | G02B 27/0977 372/50.23 |
| 6,348,358 B1 | * | 2/2002 | Sousa | H01S 5/4031 438/33 |
| 6,423,561 B1 | * | 7/2002 | Chino | H01L 24/29 257/E21.511 |
| 6,829,278 B1 | | 12/2004 | Allenson et al. | |
| 7,060,515 B2 | * | 6/2006 | Stephens | H01S 5/4018 438/122 |
| 7,092,420 B2 | * | 8/2006 | Kwak | H01S 5/0206 372/36 |
| 7,154,926 B2 | * | 12/2006 | Kouta | H01S 5/02423 372/29.013 |
| 7,664,153 B2 | | 2/2010 | Inenaga et al. | |
| 7,944,956 B2 | * | 5/2011 | Miyajima | H01L 23/473 372/50.12 |
| 8,000,360 B2 | * | 8/2011 | Faybishenko | G02B 6/4206 372/98 |
| 8,213,479 B2 | * | 7/2012 | Doerfel | G02B 27/0961 372/50.12 |
| 8,611,389 B2 | * | 12/2013 | Shiraishi | H01S 5/4018 372/50.23 |
| 8,804,781 B2 | * | 8/2014 | Schleuning | H01S 5/02423 372/36 |
| 9,001,856 B1 | * | 4/2015 | Govorkov | H01S 5/02423 372/50.12 |
| 9,450,377 B1 | * | 9/2016 | Roff | H01S 5/005 |
| 9,559,491 B2 | * | 1/2017 | Horn | H01S 5/0237 |
| 10,297,980 B2 | * | 5/2019 | Ryu | H01S 5/3013 |
| 10,630,041 B2 | * | 4/2020 | Hemenway | H01S 5/02469 |
| 11,002,926 B1 | * | 5/2021 | Mathai | G02B 6/4284 |
| 11,018,472 B2 | * | 5/2021 | Nozaki | H01S 5/4031 |
| 11,025,032 B2 | * | 6/2021 | Vethake | H01S 5/0235 |
| 2004/0115911 A1 | * | 6/2004 | Hazlett | H01S 5/0237 438/586 |
| 2006/0109883 A1 | * | 5/2006 | Lewis | H04N 9/3111 372/50.12 |
| 2008/0019010 A1 | | 1/2008 | Govorkov et al. | |
| 2008/0089371 A1 | * | 4/2008 | Reichert | H01S 5/4025 372/34 |
| 2010/0260227 A1 | * | 10/2010 | Bessho | H01S 5/0237 438/35 |
| 2011/0069731 A1 | * | 3/2011 | Gokay | H01S 5/4018 372/50.12 |
| 2012/0252144 A1 | * | 10/2012 | Schroeder | H01S 5/02365 438/26 |
| 2013/0058367 A1 | * | 3/2013 | Grove | H01S 5/024 438/26 |
| 2013/0243019 A1 | * | 9/2013 | Wakabayashi | H01S 5/024 372/36 |
| 2014/0119393 A1 | | 5/2014 | Schleuning et al. | |
| 2015/0055667 A1 | * | 2/2015 | Horn | H01S 5/4031 372/36 |
| 2017/0093125 A1 | * | 3/2017 | Demir | H01S 5/1039 |
| 2017/0244221 A1 | | 8/2017 | Paoletti et al. | |
| 2018/0062346 A1 | * | 3/2018 | Horn | H01S 5/4025 |
| 2018/0138664 A1 | * | 5/2018 | Huelsewede | H01S 5/02365 |
| 2018/0269650 A1 | * | 9/2018 | Nozaki | H01S 5/0235 |
| 2019/0280459 A1 | * | 9/2019 | Ishige | G02B 6/4206 |
| 2020/0185877 A1 | * | 6/2020 | Kawaguchi | H01S 5/0234 |
| 2020/0395738 A1 | * | 12/2020 | Von Freyhold | H01S 5/02365 |
| 2021/0057878 A1 | * | 2/2021 | Oomori | H01S 5/04254 |
| 2021/0119412 A1 | * | 4/2021 | Strohmaier | H01S 5/02423 |
| 2021/0119413 A1 | * | 4/2021 | Strohmaier | H01S 5/02469 |
| 2021/0126426 A1 | * | 4/2021 | Tillkorn | H01S 5/4018 |

FOREIGN PATENT DOCUMENTS

| | | | | |
|---|---|---|---|---|
| EP | 2485346 A2 | * | 8/2012 | ......... H01S 5/02264 |
| EP | 3736924 A4 | * | 10/2021 | ......... H01S 5/02326 |
| GB | 2417366 A | * | 2/2006 | ......... H01S 5/02252 |
| JP | 3154181 B2 | * | 4/2001 | |
| WO | WO-0063967 A1 | * | 10/2000 | ......... H01L 21/4871 |
| WO | WO 2009/049799 | | 4/2009 | |
| WO | WO-2019243325 A1 | * | 12/2019 | ......... H01S 5/02345 |
| WO | WO-2020212221 A1 | * | 10/2020 | |

* cited by examiner

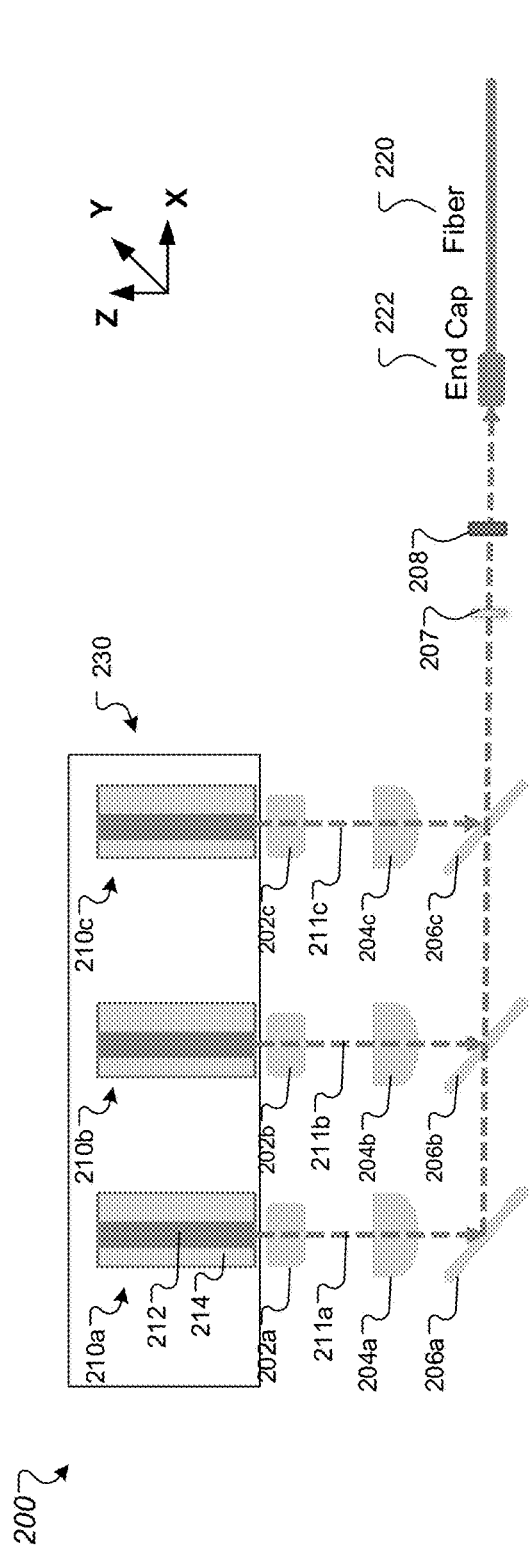
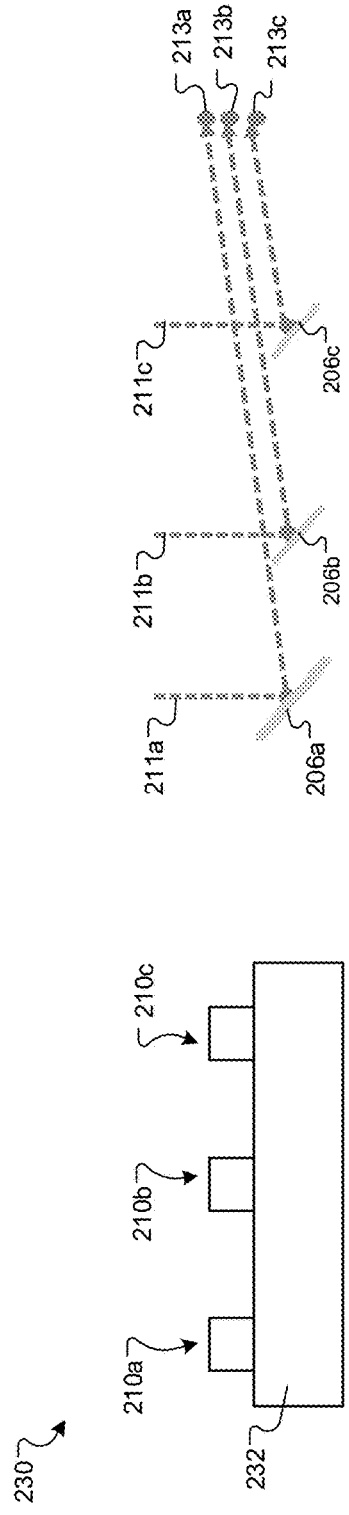
FIG. 2A
FIG. 2B
FIG. 2C

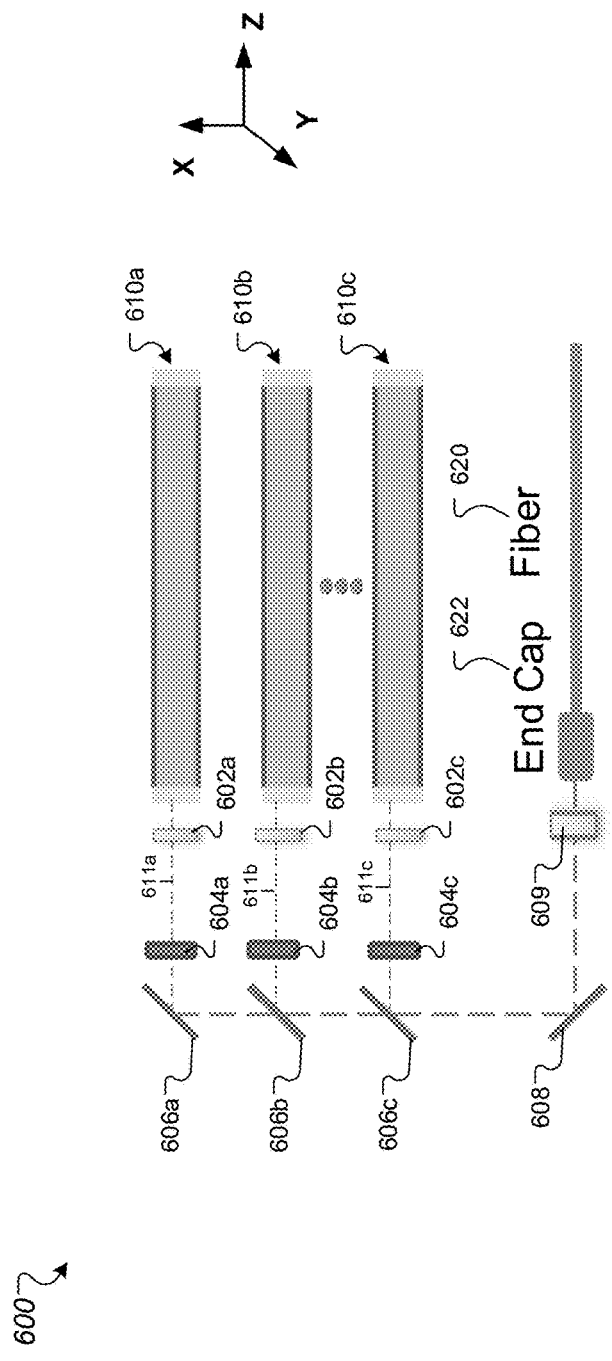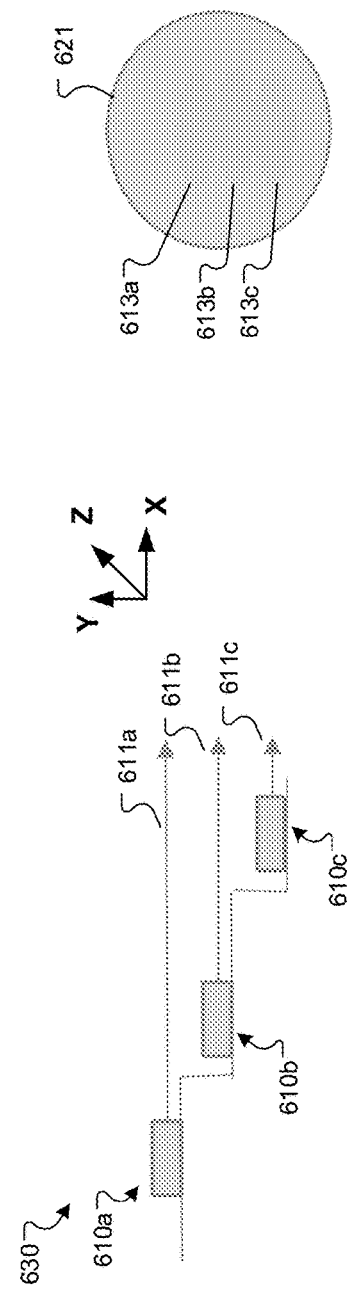

DOUBLE-SIDED COOLING OF LASER DIODES

TECHNICAL FIELD

The present disclosure relates to cooling of laser diodes.

BACKGROUND

High-powered semiconductor laser diodes are cooled to keep the junction temperature and carrier leakage low and reliability high. A laser diode can be mounted to a heat sink, which helps reduce thermal impedance.

SUMMARY

One aspect of the present disclosure features a laser diode assembly, including: a first heat sink; a plurality of submounts spaced apart from one another on the first heat sink; a plurality of laser diodes, each laser diode including a corresponding active layer between a first-type doped semiconductor layer and a second-type doped semiconductor layer, a bottom side of each laser diode being positioned on a different corresponding submount of the plurality of submounts, the plurality of laser diode being electrically connected in series; and a second heat sink on top sides of the plurality of laser diodes.

In some implementations, the laser diode assembly includes a plurality of first electrical contact pads on the second heat sink, each first electrical contact pad being positioned on the top side of a corresponding laser diode and in electrical contact with the first-type doped semiconductor layer of the corresponding laser diode, at least one first electrical contact pad providing a serial electrical connection between adjacent laser diodes.

In some implementations, the laser diode assembly includes a plurality of second electrical contact pads on the plurality of submounts, each second electrical contact pad being positioned on a different corresponding submount and in electrical contact with the second-type doped semiconductor layer of the corresponding laser diode whose bottom side is positioned on the second electrical contact pad.

In some implementations, the laser diode assembly includes a plurality of vertical electrical contacts, each vertical electrical contact providing a direct electrical connection between a corresponding first electrical contact pad and a corresponding second electrical contact pad.

In some implementations, the plurality of vertical electrical contacts and the plurality of laser diodes form a plurality of pairs, each pair being provided on a different corresponding submount and comprising a different corresponding laser diode and a different corresponding vertical electrical contact.

In some implementations, for each pair of the plurality of pairs, the different corresponding laser diode is spaced apart from the different corresponding vertical electrical contact on the different corresponding submount with a first gap. Adjacent first electrical contact pads can be spaced apart from one another on the second heat sink with a second gap, the second gap having a substantially same width as the first gap. The plurality of first electrical contact pads can be aligned with the plurality of pairs, such that each second gap is aligned with a different corresponding first gap.

In some implementations, at least one of the plurality of first electrical contact pads provides a direct electrical connection between a first vertical electrical contact in a first pair and the first-type doped semiconductor layer of a second laser diode in a second pair adjacent to the first pair.

In some examples, each vertical electrical contact includes a second-type doped semiconductor material.

In some implementations, the plurality of submounts includes a plurality of first submounts spaced apart from one another along a horizontal direction on the first heat sink. The laser diode assembly can further include a plurality of second submounts spaced apart from one another along the horizontal direction. Each laser diode of the plurality of laser diodes can be positioned along a vertical direction between a different corresponding first submount and a different corresponding second submount of the plurality of second submounts, the vertical direction being perpendicular to the horizontal direction. The second heat sink can be positioned on top of the plurality of second submounts.

In some implementations, along the vertical direction, a bottom surface of the bottom side of each laser diode is on a top surface of the different corresponding first submount, and a bottom surface of the different corresponding second submount is on a top surface of the top side of the laser diode, and bottom surfaces of the different corresponding first submounts are on a top surface of the first heat sink, and a bottom surface of the second heat sink is on top surfaces of the different corresponding second submounts.

In some implementations, the top surface of the first heat sink and the bottom surface of the second heat sink are substantially flat and parallel to each other, and a vertical distance between the corresponding active layer of each laser diode and the top surface of the first heat sink along the vertical direction is different from each other. In some implementations, for each laser diode of the plurality of laser diodes, a vertical distance between the bottom surface of the different corresponding second submount and the top surface of the different corresponding first submount along the vertical direction is substantially identical to each other, and each laser diode of the plurality of laser diodes has a substantially identical vertical thickness along the vertical direction, and vertical thicknesses of the different corresponding second submounts along the vertical direction are different from one another, and vertical thicknesses of the different corresponding first submounts along the vertical direction are different from one another.

In some implementations, each first submount and each second submount comprise an electrically conductive material. The laser diode assembly includes: a plurality of first electrical contact pads on the first heat sink, at least one first electrical contact pad providing a first serial electrical connection between first adjacent laser diodes through corresponding adjacent first submounts, and a plurality of second electrical contact pads on the second heat sink, at least one second electrical contact pad providing a second serial electrical connection between second adjacent laser diodes through corresponding adjacent second submounts.

In some implementations, the first heat sink includes a plurality of first steps consecutive to one another, each submount of the plurality of submounts being positioned on a different corresponding first step of the plurality of first steps, and the second heat sink includes a plurality of second steps consecutive to one another, a different corresponding second step of the plurality of second steps being on the top side of each laser diode of the plurality of laser diodes.

In some implementations, the laser diode assembly includes a plurality of electrical contact pads, each electrical contact pad being on a different corresponding second step of the second heat sink and in electrical contact with the first-type doped semiconductor layer of a corresponding laser diode on which the different corresponding second step is positioned.

In some implementations, the laser diode includes a first facet and a second facet opposite to the first facet, the first facet and the second facet being parallel to each other, and the laser diode is configured to emit light from at least one of the first facet or the second facet.

Another aspect of the present disclosure features a method of fabricating a laser diode assembly. The method includes: positioning each laser diode of a plurality of laser diodes on a different corresponding submount of a plurality of submounts, each laser diode including a corresponding active layer between a first-type doped semiconductor layer and a second-type doped semiconductor layer, a bottom side of the laser diode being on the different corresponding submount; positioning the plurality of submounts on a first heat sink, each submount of the plurality of submounts being spaced apart from one another on the first heat sink; and positioning a second heat sink on top sides of the plurality of laser diodes.

In some implementations, the method includes: forming a plurality of first electrical contact pads on the second heat sink, each first electrical contact pad being positioned on the top side of a corresponding laser diode and in electrical contact with the first-type doped semiconductor layer of the corresponding laser diode, at least one first electrical contact pad providing a serial electrical connection between adjacent laser diodes; forming a plurality of second electrical contact pads on the plurality of submounts, each second electrical contact pad being formed on a different corresponding submount and in electrical contact with the second-type doped semiconductor layer of the corresponding laser diode whose bottom side is positioned on the second electrical contact pad; and forming a plurality of vertical electrical contacts on the plurality of second electrical contact pads, each vertical electrical contact being on a different corresponding second electrical contact pad and spaced apart from the corresponding laser diode on the different corresponding second electrical contact pad by a corresponding first gap.

In some implementations, adjacent first electrical contact pads are spaced apart from one another on the second heat sink with a corresponding second gap, the corresponding second gap having a substantially same width as the corresponding first gap. In some implementations, positioning a second heat sink on top sides of the plurality of laser diodes includes: inserting a plurality of spacers into the corresponding first gaps; and arranging the plurality of spacers into the corresponding second gaps of the plurality of first electrical contact pads, such that each first electrical contact pad provides an electrical connection between a vertical electrical contact corresponding to a first laser diode and the first-type doped semiconductor layer of a second laser diode adjacent to the first laser diode.

In some implementations, the method includes: positioning a different corresponding second submount of a plurality of second submounts on the top side of each laser diode of the plurality of laser diodes, the second heat sink being positioned on the plurality of second submounts.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

FIG. 2A is a schematic illustrating a system for integrating single-sided emissions from multiple laser diodes in a laser diode assembly.

FIG. 2B is a side view of the laser diode assembly of FIG. 2A.

FIG. 2C is a schematic illustrating aligned multiple laser emission spots from the laser diode assembly in the system of FIG. 2A.

FIG. 6A is a schematic illustrating another system for integrating single-sided emissions from multiple laser diodes in a laser diode assembly.

FIG. 6B is a side view of the laser diode assembly of FIG. 6A.

FIG. 6C is a schematic illustrating aligned multiple laser emission spots from the laser diode assembly in the system of FIG. 6A.

DETAILED DESCRIPTION

Figure 1:
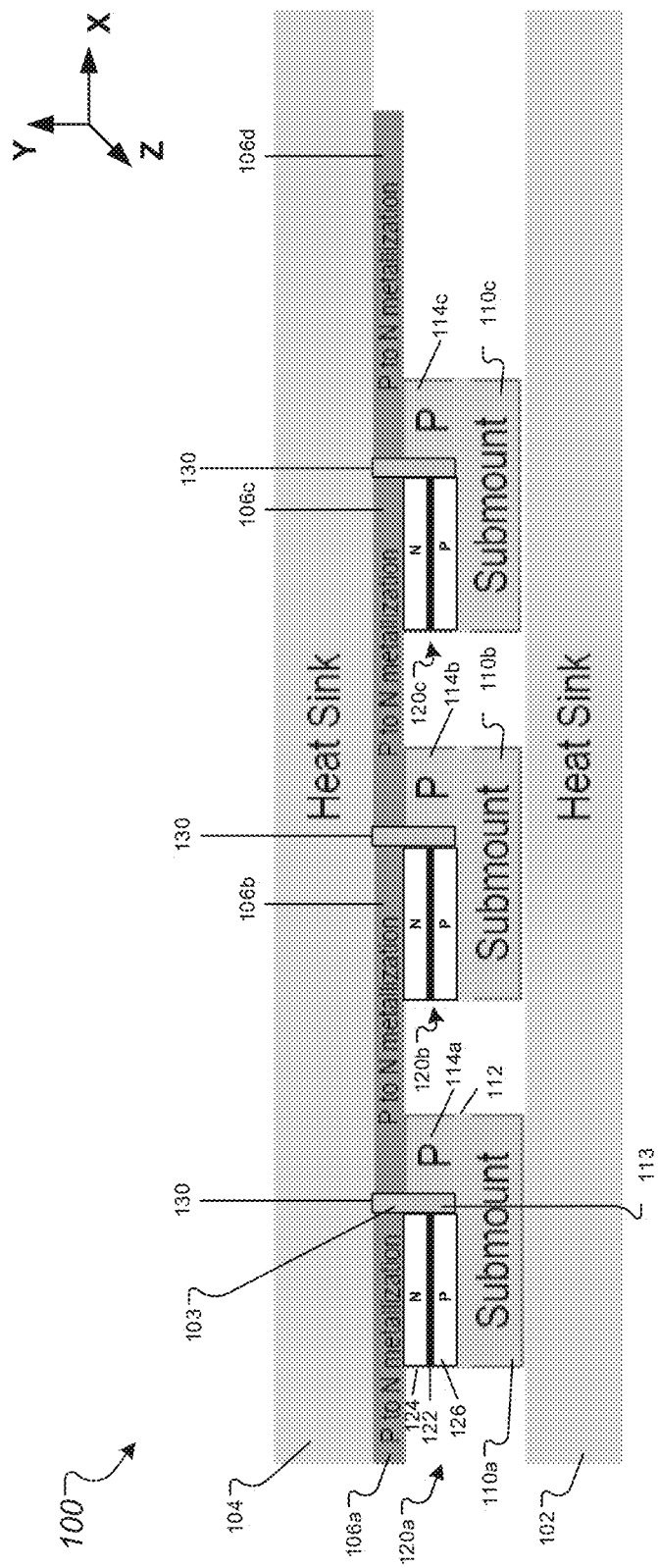
FIG. 1 is a schematic illustrating an example of a laser diode assembly for double-sided cooling of laser diodes.

The output power of laser diodes is limited in large part by heat dissipation, which causes the temperature of the laser diodes to increase, which, in turn, can reduce the reliability and operating efficiency of the laser diodes. Heat sinks with high thermal conductivity, such as copper coolers, can be used to keep the laser diode temperature stable during operation. Cooling on both sides (i.e., double-sided cooling) of a laser diode, rather than cooling on a single side (i.e., single-sided cooling), can improve the stability and operating efficiency of the laser diode even further. However, making electrical contact to a laser diode cooled on two sides can be complicated since it may be difficult to access contact pads coupled to the laser diode. Furthermore, double-sided cooling can lead to damage of the laser diode resulting from forces applied during the mounting process.

A laser diode has two (front and rear) facets. In some cases, the laser diode emits laser light from the front facet only, and the laser diode can be considered as a laser diode with single-sided emission. In some cases, the laser diode emits laser light from both of the front and rear facets, and the laser diode can be considered as a laser diode with double-sided emission. Double-sided emission allows to extract about double of the output power than single-sided emission, without increasing the critical facet load that may lead to catastrophic optical mirror damage (COMD). However, the dissipated heat can be also doubled, which can raise a higher cooling requirement.

Multiple laser diodes can be arranged or packaged together to scale up the output power. However, it may be challenging to efficiently and effectively cool the packaged multiple laser diodes. Moreover, extracting the laser light beams from both sides of the laser diodes without obstruction by submounts becomes an engineering challenge due to mechanical tolerance.

Implementations of the present disclosure provide methods, devices, and systems for double-sided cooling (actively or passively) of multiple laser diodes (with single-sided emission or double-sided emission), which can significantly scale up an output power, improve efficiency, simply system configurations, and reduce cost. Implementations of the present disclosure can also provide compact laser platforms for high-power, high-brightness diode laser modules based on single emitters, and enable the ability to cool laser diode chips from both sides and to extract optical power from both facets, thereby achieving at least double power from a package with an identical footprint but with single-sided emission.

In some implementations, double-sided cooling of multiple laser diodes is implemented by mounting individual laser diodes on a staircase-like substrate with subsequent bending mirrors for optical stacking in fast axis. Each laser diode can be mounted p-side down on a submount and then the laser diode on the submounts are mounted to different stairs of a pair of staircase-like heat sinks. The heat sinks can be thermally conductively cooled or by forced liquid. Each heat sink can be electrically insulated. The laser diodes can be electrically connected in series by being soldered simultaneously on patterned conductive pads on one of the heat sinks.

In some implementations, double-sided cooling of multiple laser diodes is implemented by mounting individual laser diodes on flat heat sinks with subsequent micro-optics for optical stacking in fast axis. The laser diodes can be mounted with both sides to the flat heat sinks such that optical stacking in fast axis can be performed via the micro-optics. The heat sinks can be either thermally conductively cooled or by forced liquid. The heat sinks can be made of an electrically insulating material. At least one of the heat sinks can be patterned with electrically conductive pads (or metallization) on the electrically insulating material thus enabling a serial electrical connection of the laser diodes after bonding on the patterned conductive pads on the flat heat sink.

In some implementations, double-sided cooling of multiple laser diodes is implemented by arranging (or sandwiching) individual laser diodes between submounts of tailored thickness. Sandwiches of constant thickness can be made by soldering the submounts of tailored thickness to both p and n-sides of each laser diode. The thicknesses of the submounts are designed such that the laser diodes are at different positions in fast axis for each sandwich. Multiple sandwiches can be then packaged between parallel cooling plates resulting in a staircase-like arrangement of the individual laser diodes and optical stacking in fast axis is accomplished by bending mirrors.

FIG. 1 is a schematic illustrating an example of a laser diode assembly 100 for double-sided cooling of laser diodes. The laser diode assembly 100 includes a first heat sink 102, a second heat sink 104, a plurality of submounts 110a, 110b, 110c (referred to generally as submounts 110 and individually as a submount 110), and a plurality of laser diodes 120a, 120b, 120c (referred to generally as laser diodes 120 and individually as a laser diode 120). As an example, three laser diodes 120 are illustrated in FIG. 1. However, a different number of laser diodes can be also included in the laser diode assembly 100, e.g., 8 or 16. In some examples, the laser diode assembly 100 has a dimension of 40 mm in length (along Z direction), 80 mm in width (along X direction), and 15 mm in height (along Y direction).

Each of the first heat sink 102 and the second heat sink 104 can include, e.g., an integrated cooler device that has one or more integrated internal coolant passages, as well as an electrically conductive mounting layer separated from the integrated coolant passages by an insulating layer.

The plurality of submounts 110 are spaced apart from one another on the first heat sink 102 along a horizontal direction, e.g., along X direction. A bottom side of each laser diode 120 is positioned on a different corresponding submount 110. The second heat sink 104 is on top sides of the plurality of laser diodes 120. The plurality of laser diodes 110 are electrically connected in series in the laser diode assembly 100.

Each laser diode 120 can be a single emitter configured to emit light. As illustrated in FIG. 1, each laser diode 120 includes a corresponding active layer 122 between a first-type doped semiconductor layer (e.g., N-type layer) 124 and a second-type doped semiconductor layer (e.g., P-type layer) 126. A metallic layer (e.g., gold) can be deposited on each of the semiconductor layers 124, 126 for electrical connection.

The laser diode 120 includes front and rear facets, e.g., on X-Y plane. The laser diode 120 is configured to emit the light from at least one of the facets, e.g., from the front facet only, or from both the front and rear facets. In some implementations, the rear facet has a substantially higher reflectivity than the front facet, and the laser diode 120 is configured to emit the light the front facet. In some implementations, the rear facet has a reflectivity substantially same as the front facet, and the laser diode 120 is configured to emit a first light beam from the front facet and a second light beam from the rear facet. The emitted light is along the Z direction perpendicular to the facet(s). Each laser diode 120 can be in the form of a single-emitter laser diode chip. In some examples, the chip has a dimension of 0.6 mm in width (along X direction), 0.1 mm in height (along Y direction), and 5 mm in length (along Z direction). The laser diode chip can have a slow axis along the horizontal direction (e.g., X direction) and a fast axis along a vertical direction (e.g., Y direction). In some implementations, the plurality of laser diodes 120 form a laser diode bar positioned between the heat sinks 102 and 104. Each laser diode 120 extends along Z direction. The laser diodes in the laser diode bar are distributed along the horizontal direction, e.g., X direction. The opposite mounting surfaces of the heat sinks 102 and 104 can be parallel to each other. The plurality of laser diodes 120 can be arranged on a substantially same plane.

In some implementations, the laser diode assembly 100 further includes a plurality of first electrical contact pads 106a, 106b, 106c, 106d (referred to generally as first electrical contact pads 106 and individually as a first electrical contact pad 106) on the second heat sink 104. The first electrical contact pads 106 can be deposited on the second heat sink 104 by patterned metallization, e.g., with metal such as copper or copper tungsten. In some examples, the first electrical contact pad 106 has a thickness in a range from 0.03 mm to 0.1 mm. Adjacent first electrical contact pads 106 are spaced apart from one another on the second heat sink 104 with a physical gap 103 along the horizontal direction, e.g., X direction. The plurality of first conductive pads 106 are electrically isolated from one another on the second heat sink 104.

Each first electrical contact pad 106 is positioned on the top side of a corresponding laser diode 120 and in electrical contact with the first-type doped semiconductor layer 124 of the corresponding laser diode 120. At least one first electrical contact pad provides a serial electrical connection between adjacent laser diodes 120. For example, as illustrated in FIG. 1, the first electrical contact pad 106b electrically connects the laser diodes 120a and 120b, and the first electrical contact pad 106c electrically connects the laser diodes 120b and 120c.

Each submount 110 is thermally conductive. In some examples, the submount 110 is made of AlN, BeO, or diamond. In some examples, the submount 110 is made from silicon using standard micro processing equipment and can include micro-channels for forced liquid cooling. A length of the submount 110 can have a tolerance of less than 2 μm (e.g., along Y direction). For example, precision machined submounts with a length tolerance of less than 2 μm can be cost-effectively procured as the submounts 110.

In some implementations, each submount 110 is electrically isolated. In some examples, each submount 110 is deposited with a corresponding electrically conductive layer 112, e.g., a metallic layer. The laser diode 120 can be mounted onto the corresponding submount 110, e.g., via eutectic bonding, through the electrically conductive layer 112. The electrically conductive layer 112 can be a bonding layer, e.g., made of gold and gold-tin bilayers. The electrically conductive layer 112 is functioned as a second electrical contact pad positioned on a different corresponding submount 110 and in electrical contact with the second-type doped semiconductor layer 126 of the corresponding laser diode 120 whose bottom side is positioned on the second electrical contact pad 112.

In some implementations, the laser diode assembly 100 further includes a plurality of vertical electrical contacts 114a, 114b, 114c (referred to generally as vertical electrical contacts 114 and individually as a vertical electrical contact 114). Each vertical electrical contact 114 can include a second-type doped semiconductor material, e.g., P-type, same as that of the second-type doped semiconductor layer 126 in the laser diode 120. Each vertical electrical contact 114 provides a direct electrical connection between a corresponding first electrical contact pad 106 and a corresponding second electrical contact pad 112. In such a way, the adjacent laser diodes 120 can be electrically connected via the corresponding second electrical contact pad 112, the vertical electrical contact 114, and the corresponding first electrical contact pad 106. For example, the laser diodes 120a, 120b are electrically connected by electrically connecting the P-type layer 126 of the laser diode 120a to the N-type layer 124 of the laser diode 120b sequentially through the second electrical contact pad 112, the vertical electrical contact 114a, and the first electrical contact pad 106b.

In some implementations, the submounts 110 are electrically conductive. The first heat sink 102 is electrically isolated. Each of the plurality of submounts 110 is electrically isolated from one another. A laser diode 120 and a vertical electrical contact 114 are directly mounted on a corresponding submount 110 and electrically conductive to each other through the submount 110.

As illustrated in FIG. 1, the plurality of vertical electrical contacts 114 and the plurality of laser diodes 120 form a plurality of pairs. Each pair is provided on a different corresponding submount 110 and includes a different corresponding laser diode 120 and a different corresponding vertical electrical contact 114 spaced apart with a physical gap 113. At least one of the plurality of first electrical contact pads 106 provides a direct electrical connection between a first vertical electrical contact 114 in a first pair and the first-type doped semiconductor layer 124 of a second laser diode 120 in a second pair adjacent to the first pair. Each vertical electrical contact 114 has a height (along a vertical direction such as Y direction) substantially same as each laser diode 120. Mounting surfaces of the first heat sink 102 and the second heat sink 104 are substantially flat and parallel to each other, e.g., along the horizontal direction such as X direction.

The gap 113 can have a substantially same width (e.g., along the horizontal direction such as X direction) as the gap 103 between adjacent first electrical contact pads 106. The plurality of first electrical contact pads 106a can be aligned with the plurality of pairs, such that each gap 103 is aligned with a different corresponding gap 113. In some implementations, during fabrication of the laser diode assembly 110, spacers 130 are positioned in the gaps 103 and 113 to place the laser diodes 120, the submounts 110, and the heat sink 104 in corresponding positions.

The laser diode assembly 100 can be fabricated in a fabrication process. In some implementations, the process includes: positioning a bottom side of each laser diode of a plurality of laser diodes 120 on a different corresponding submount of a plurality of submounts 110, positioning the plurality of submounts 110 on a first heat sink 102, each submount 110 being spaced apart from one another on the first heat sink 102, and positioning a second heat sink 104 on top sides of the plurality of laser diodes 120.

The process can further include forming a plurality of first electrical contact pads 106 on the second heat sink 104, e.g., by patterned metallization. Each first electrical contact pad 106 is positioned on the top side of a corresponding laser diode 120 and in electrical contact with a first-type doped semiconductor layer 124 of the corresponding laser diode 120. At least one first electrical contact pad 106 provides a serial electrical connection between adjacent laser diodes 120.

The process can further include forming a plurality of second electrical contact pads 112 on the plurality of submounts 110. Each second electrical contact pad 112 can be formed on a different corresponding submount 110 and in electrical contact with a second-type doped semiconductor layer 126 of the corresponding laser diode 120 whose bottom side is positioned on the second electrical contact pad 112.

The process can further include forming a plurality of vertical electrical contacts 114 on the plurality of second electrical contact pads 112. Each vertical electrical contact 114 is on a different corresponding second electrical contact pad 112 and spaced apart from the corresponding laser diode 120 on the different corresponding second electrical contact pad 112 by a corresponding first gap 113.

Adjacent first electrical contact pads 106 are spaced apart from one another on the second heat sink 104 with a corresponding second gap 103 that has a substantially same width as the corresponding first gap 113. In some implementations, positioning the second heat sink 104 on the top sides of the plurality of laser diodes 120 includes: inserting a plurality of spacers 130 into the corresponding first gaps 113, and arranging the plurality of spacers 130 into the corresponding second gaps 103 of the plurality of first electrical contact pads 106, such that each first electrical contact pad 106 provides an electrical connection between a vertical electrical contact corresponding to a first laser diode 120 and the first-type doped semiconductor layer 124 of a second laser diode 120 adjacent to the first laser diode 120. The first electrical contact pads 106 can be bonded onto the first-type doped semiconductor layer 124 of the first laser diode 120 and a corresponding vertical electrical contact 114.

FIGS. 2A-2C illustrate a system 200 for integrating single-sided emissions from multiple laser diodes in a laser diode assembly 230. The laser diode assembly 230 can be the laser diode assembly 100 of FIG. 1. The system 200 is configured to combine laser light beams emitted from the laser diodes into a single fiber 220 having an end cap 222.

The laser diode assembly 230 includes a plurality of laser diode devices 210a, 210b, 210c (referred to generally as laser diode devices 210 and individually as a laser diode device 210) positioned on a substrate 232. Each laser diode device 210 includes a laser diode 212 (e.g., the laser diode 120 of FIG. 1) mounted on a submount 214 (e.g., the submount 110 of FIG. 1). The laser diode 212 in each laser diode device 210a, 210b, 210c is configured to emit a corresponding laser light beam 211a, 211b, 211c (referred to generally as light beams 211 and individually as a light beam 211) from a single facet, e.g., a front facet of the laser diode. That is, the laser diode 212 is a laser diode with a single-sided emission.

The substrate 232 can be a flat substrate, such that the light beams 211 emitted from the laser diodes 212 can have a same height. The substrate 232 can be a heat sink, e.g., the heat sink 102 of FIG. 1, for cooling the laser diodes 212. In some implementations, the laser diodes 212 are double-sided cooled with the heat sink 232 and a second heat sink (not shown), e.g., the second heat sink 104 of FIG. 1, positioned on top sides of the laser diodes 212.

The light beam 211a, 211b, 211c from each laser diode device 210a, 210b, 210c propagates through a first optical component 202a, 202b, or 202c (referred to a first optical component 202) and a second optical component 204a, 204b, or 204c (referred to a second optical component 204) for beam shaping and is then individually redirected by a corresponding redirecting mirror 206a, 206b, 206c. In some implementations, the first component 202 includes a Fast-Axis Collimating (FAC) lens configured to collimate the light beam 211 from the laser diode 212 along the fast axis of the light beam 211. The second component 204 includes a Slow Axis Collimator (SAC) lens configured to collimate the light beam 211 along the slow axis of the light beam 211. The redirecting mirrors 206a, 206b, 206c can be configured to be angled such that the collimated light beams 211a, 211b, 211c are spaced in parallel, and beam spots 213a, 213b, 213c of the light beam 211a, 211b, 211c are stacked along a direction (e.g., along the fast axis), as illustrated in FIG. 2C.

The collimated light beams 211a, 211b, 211c are focused by a focusing component 207 (e.g., an optical lens) to be coupled into the fiber 220 through the end cap 222. In some examples, the end cap 222 has a diameter more than 1 mm, e.g., 8 mm. In some examples, the fiber 220 has a core with a diameter more than 100 μm, e.g., 135 μm.

The numerical aperture (NA) of the fiber 220 can be, e.g., 0.15. In some implementations, an optical retarder 208 (e.g., a polarizer such as a half waveplate) is arranged between the focusing component 207 and the end cap 222 and configured to adjust a polarization state of the focused light beams onto the end cap 222.

Figure 3:
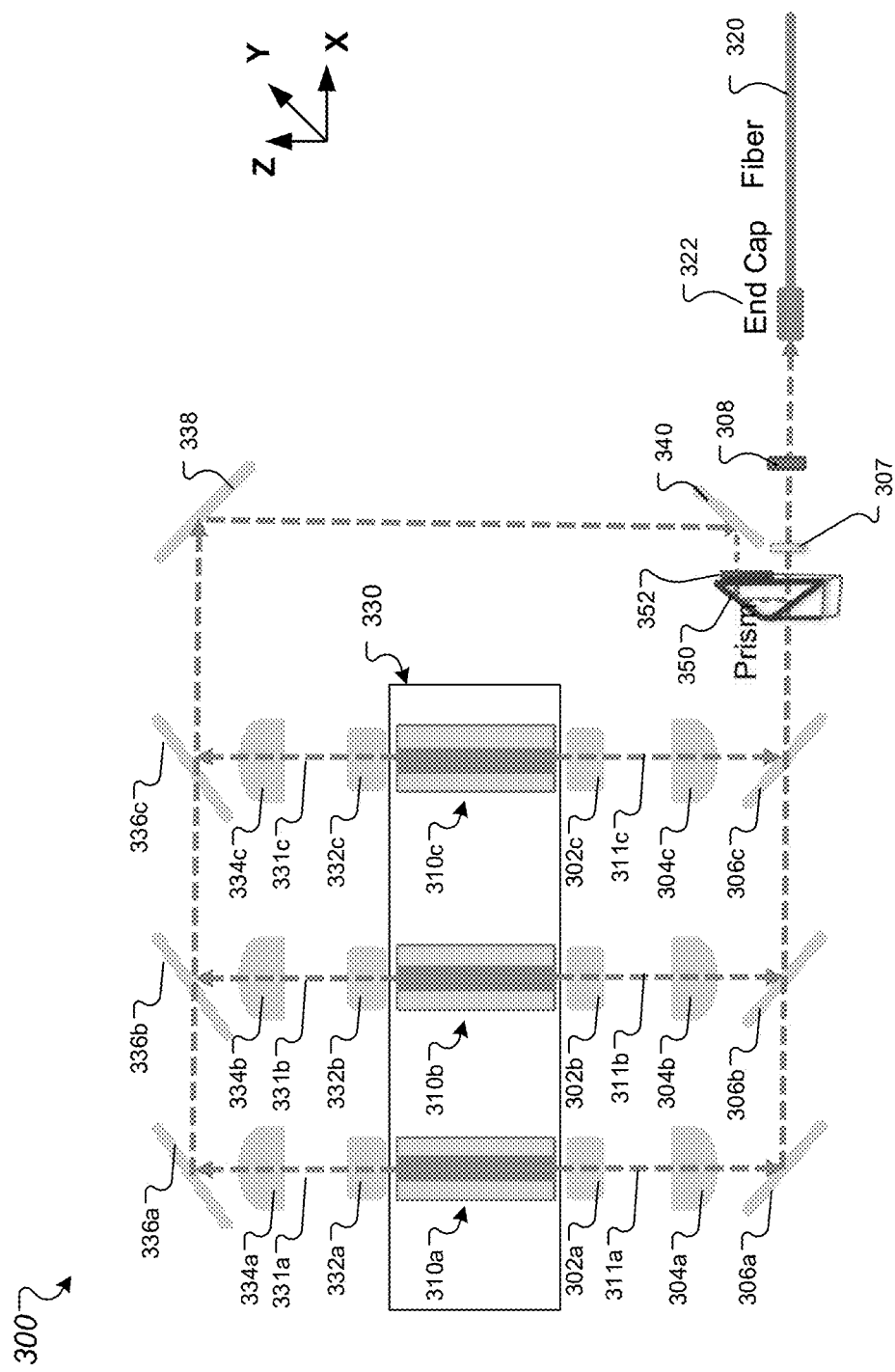
FIG. 3 is a schematic illustrating a system for integrating double-sided emissions from multiple laser diodes in a laser diode assembly.

FIG. 3 is a schematic illustrating a system 300 for integrating double-sided emissions from multiple laser diode devices in a laser diode assembly 330. The laser diode assembly 330 can be the laser diode assembly 100 of FIG. 1. The system 300 is configured to combine laser light beams emitted from the laser diode devices with double-sided emission into a single fiber 320 (e.g., the fiber 220 of FIG. 2A) having an end cap 322 (e.g., the end cap 222 of FIG. 2A).

Similar to the laser diodes 210 in the laser diode assembly 230 of FIGS. 2A-2B, laser diode devices 310a, 310b, 310c (referred to generally as laser diode devices 310 and individually as a laser diode device 310) are individually mounted on different corresponding submounts in the laser diode assembly 330. Different from the laser diode devices 210 of FIGS. 2A-2B including the laser diodes 212 with single-sided emission, laser diodes of laser diode devices 310 are for double-sided emission and configured to emit laser light beams from both front and rear facets.

As illustrated in FIG. 3, each laser diode device 310a, 310b, 310c emits a first light beam 311a, 311b, 311c (referred to generally as first light beams 311 and individually as a first light beam 311) from the front facet, and a second light beam 331a, 331b, 331c (referred to generally as second light beams 331 and individually as a second light beam 331). Each laser diode device 310 can be double-sided cooled by two heat sinks, e.g., the heat sinks 102 and 104 as illustrated in FIG. 1. The heat sinks can be flat with mounting surfaces being parallel to each other. The laser diode devices 310 can have a same height between the mounting surfaces of the heat sinks and can emit the light beams at the substantially same height.

The system 300 is configured to integrate the first light beams 311 from the front facets of the laser diode devices 310 and the second light beams 331 from the back facets of the laser diode devices 310 together onto the end cap 322 of the fiber 320. As illustrated in FIG. 3, each first light beam 311a, 311b, 311c propagates through a first optical component 302a, 302b, 302c (e.g., the first optical component 202 of FIG. 2A such as an FAC lens) and a second optical component 304a, 304b, 304c (e.g., the second optical component 204 of FIG. 2A such as a SAC lens) and is reflected by a first redirecting mirror 306a, 306b, 306c (e.g., the redirecting mirror 206 of FIG. 2A) onto a first surface of an optical combiner 350 (e.g., an optical prism). The first redirecting mirrors 306a, 306b, 306c can be configured to be angled such that collimated beam spots of the first light beams 311 are stacked and separated along a direction (such as Y direction), e.g., as illustrated in FIG. 2C. The direction can be along a fast axis of the light beams 311.

Each second light beam 331a, 331b, 331c propagates through another first optical component 332a, 332b, 332c (e.g., the first optical component 202 of FIG. 2A such as an FAC lens) and another second optical component 334a, 334b, 334c (e.g., the second optical component 204 of FIG. 2A such as a SAC lens) and is reflected by a second redirecting mirror 336a, 336b, 336c (e.g., the redirecting mirror 206 of FIG. 2A) onto a second surface of the optical combiner 350 via a pair of redirecting mirrors 338 and 340. The second redirecting mirrors 336a, 336b, 336c can be configured to be angled such that collimated beam spots of the second light beams 331 are stacked and separated along the direction (such as Y direction), e.g., as illustrated in FIG. 2C. In some implementations, an optical retarder 352 (e.g., a polarizer) is arranged on the second surface of the prism 350 and configured to adjust a polarization state of the second light beams 331. The optical combiner 350 can be configured to redirect the first light beams 311 and the second light beams 331 along a same direction (such as X direction) towards the end cap 322 of the fiber 320 and to be stacked and spaced along Y direction (e.g., along the fast axis).

A focusing component 307 (e.g., the focusing component 207 of FIG. 2A) is configured to focus the first light beams 311 and the second light beams 331 onto the end cap 322. An optical retarder 308 (e.g., the optical retarder 208 of FIG. 2A) can be arranged between the focusing component 307 and the end cap 322 and configured to adjust a polarization state of the focused first light beams 311 and the focused second light beams 331.

Figure 4:
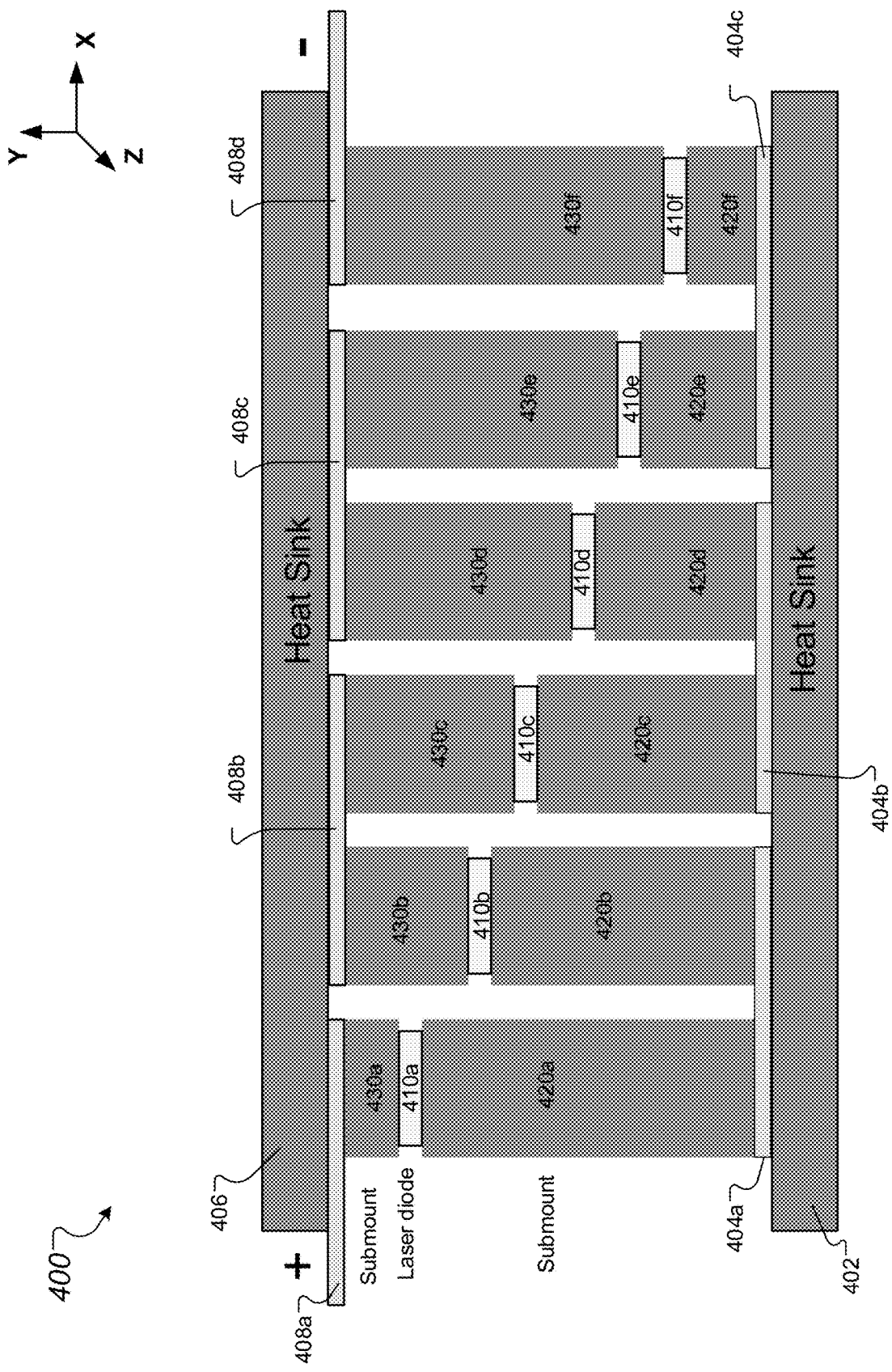
FIG. 4 is a schematic illustrating another example of a laser diode assembly for double-sided cooling of laser diodes.

FIG. 4 is a schematic illustrating another example of a laser diode assembly 400 for double-sided cooling of laser diodes. The laser diode assembly 400 includes a first heat sink 402, a second heat sink 406, and a plurality of laser diodes 410a, 410b, 410c, 410d, 410e, 410f (referred to generally as laser diodes 410 and individually as a laser diode 410). As an example, six laser diodes 410 are illustrated in FIG. 4. However, a different number of laser diodes can be also included in the laser diode assembly 400. Each laser diode can be the laser diode 120 of FIG. 1. Each laser diode can be for single-sided emission or for double-sided emission. The laser diodes 410 are electrically connected in series. Each of the first heat sink 402 and the second heat sink 404 can be the first heat sink 102 of FIG. 1 or the second heat sink 104 of FIG. 1.

Different from the laser diodes 120 of FIG. 1 each positioned on a single submount, each laser diode 410 is arranged between a pair of submounts. As illustrated in FIG. 4, the laser diode assembly 400 includes a plurality of first submounts 420a, 420b, 420c, 420d, 420e, 420f (referred to generally as first submounts 420 and individually as a first submount 420) and a plurality of second submounts 430a, 430b, 430c, 430d, 430e, 430f (referred to generally as second submounts 430 and individually as a second submount 430). Each laser diode 410 is sandwiched by a corresponding first submount 420 and a corresponding second submount 430. Each of the first and second submounts 420, 430 is electrically conductive and thermally conductive, e.g., made of electrically conductive material such as copper.

The laser diode assembly 400 further includes a plurality of first electrical contact pads 404a, 404b, 404c (referred to generally as first electrical contact pads 404 and individually as a first electrical contact pad 404) on the first heat sink 402. The first electrical contact pads 404 can be deposited on the first heat sink 402 by patterned metallization, e.g., with metal such as copper or copper tungsten. At least one first electrical contact pad 404 provides a first serial electrical connection between first adjacent laser diodes 410 through corresponding adjacent first submounts 420 that are electrically conductive. For example, as illustrated in FIG. 4, the laser diodes 410a, 410b are electrically connected via the first submount 420a, the first electrical contact pad 404a, and the first submount 420b.

The laser diode assembly 400 further includes a plurality of second electrical contact pads 408a, 408b, 408c (referred to generally as second electrical contact pads 408 and individually as a second electrical contact pad 408) on the second heat sink 406. The second electrical contact pads 408 can be deposited on the second heat sink 406 by patterned metallization, e.g., with metal such as copper or copper tungsten. At least one second electrical contact pad 408 provides a second serial electrical connection between second adjacent laser diodes 410 through corresponding adjacent second submounts 430. For example, as illustrated in FIG. 4, the laser diodes 410b, 410c are electrically connected via the second submount 430b, the second electrical contact pad 408b, and the second submount 430c. In such a way, the laser diodes 410 can be electrically connected in series along a horizontal direction, e.g., along X direction. The second electrical contact pads, e.g., 408a and 408d, at two ends of the second electrical contact pads can be separately coupled to a positive voltage (or current) and a negative voltage (or current) of a power source.

The plurality of first submounts 420 are spaced apart from one another along the horizontal direction (e.g., along X direction) on the first heat sink 402 via the first electrical contact pads 404. The plurality of second submounts 430 are spaced apart from one another along the horizontal direction on the second heat sink 406 via the second electrical contact pads 408. Each laser diode 410 is positioned along a vertical direction between a different corresponding first submount 420 and a different corresponding second submount 430. The vertical direction (e.g., Y direction) is perpendicular to the horizontal direction (e.g., X direction). The second heat sink 406 is positioned on top of the plurality of second submounts 430.

Along the vertical direction, a bottom surface of the bottom side of each laser diode 410 is on a top surface of the different corresponding first submount 420, and a bottom surface of the different corresponding second submount 430 is on a top surface of the top side of the laser diode 410. Bottom surfaces of the different corresponding first submounts 420 are on a top surface of the first heat sink 402, and a bottom surface of the second heat sink 406 is on top surfaces of the different corresponding second submounts 430.

In some implementations, the top surface of the first heat sink 402 and the bottom surface of the second heat sink 406 are substantially flat and parallel to each other. A vertical distance between a corresponding active layer of each laser diode 410 and the top surface of the first heat sink 402 along the vertical direction can be different from each other. For example, as illustrated in FIG. 4, the vertical distance can gradually decrease from left to right along the horizontal direction. For each laser diode 410, a vertical distance between the bottom surface of the different corresponding second submount 430 and the top surface of the different corresponding first submount 420 along the vertical direction (e.g., along Y direction) is substantially identical to each other. Each laser diode 410 can have a substantially identical vertical thickness along the vertical direction. Vertical thicknesses of the different corresponding second submounts 430 along the vertical direction are different from one another, and vertical thicknesses of the different corresponding first submounts 420 along the vertical direction are different from one another. For each laser diode 410, a sum of the vertical thickness of the corresponding first submount 420 and the vertical thickness of the corresponding second submount is identical.

The laser diode assembly 400 can be fabricated by a fabrication process. In some implementations, the process includes: positioning each laser diode 410 of a plurality of laser diodes on a different corresponding first submount 420 of a plurality of first submounts, a bottom side of the laser diode 410 being on the different corresponding first submount 420, positioning the plurality of first submounts 420 on a first heat sink 402, each first submount 420 being spaced apart from one another on the first heat sink 402, and positioning a second heat sink 406 on top sides of the plurality of laser diodes 410. The process further includes positioning a different corresponding second submount 430 of a plurality of second submounts on the top side of each laser diode 410 of the plurality of laser diodes, the second heat sink 406 being positioned on the plurality of second submounts 430.

Mounting surfaces of the first heat sink 402 and the second heat sink 406 can be substantially flat and parallel to each other. For each of the plurality of laser diodes 410, a total height of the laser diode 410, the corresponding first submount 420, and the corresponding second submount 430 is substantially same. Each of the plurality of laser diodes 410 is in a respective plane with a different height.

Figure 5:
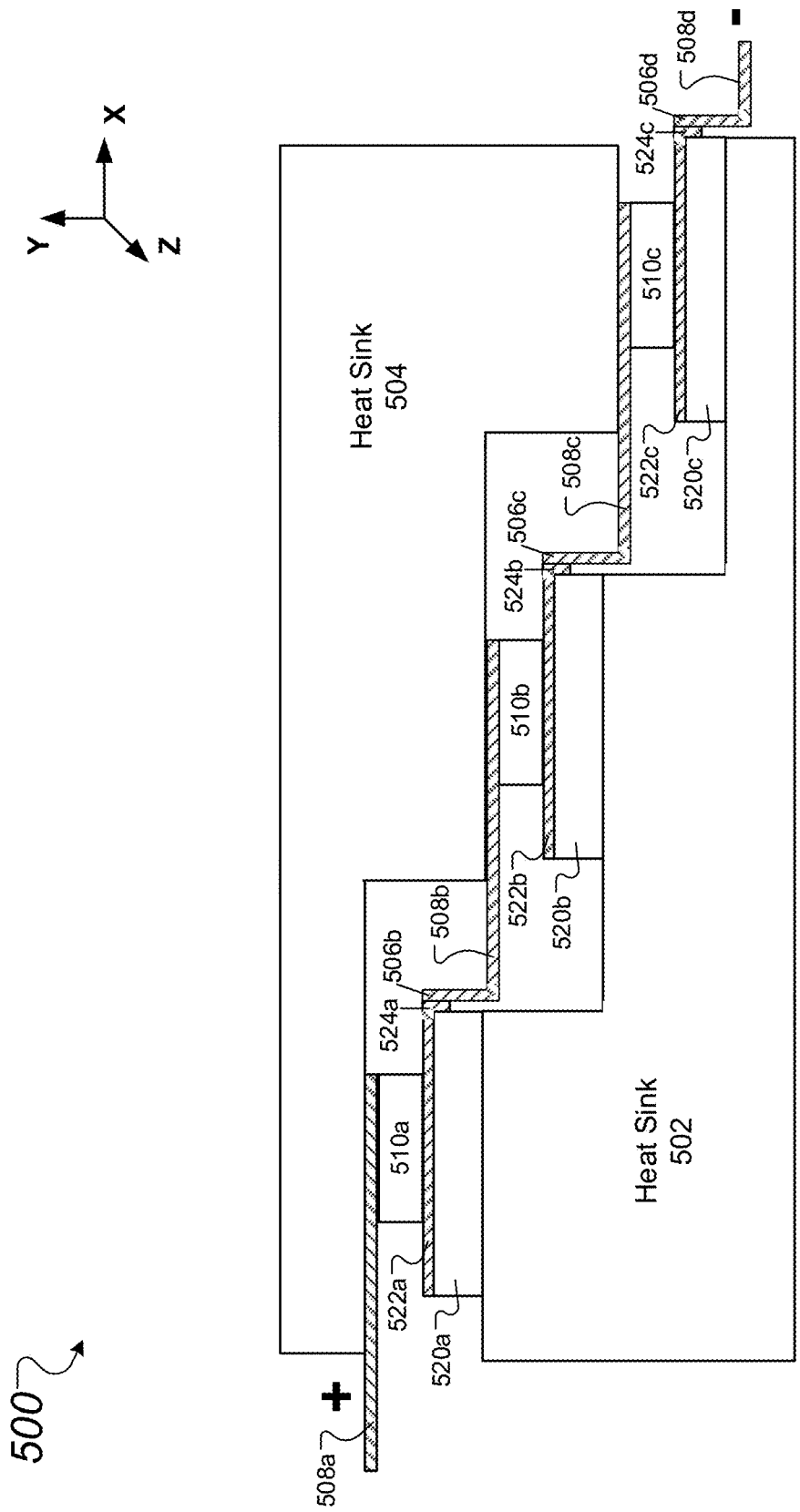
FIG. 5 is a schematic illustrating another example of a laser diode assembly for double-sided cooling of laser diodes.

FIG. 5 is a schematic illustrating another example of a laser diode assembly 500 for double-sided cooling of laser diodes. The laser diode assembly 500 includes a first heat sink 502, a second heat sink 504, a plurality of laser diodes 510a, 510b, 510c (referred to generally as laser diodes 510 and individually as a laser diode 510), and a plurality of submounts 520a, 520b, 520c (referred to generally as submounts 520 and individually as a submount 520). The submounts 520 are spaced apart from one another on the first heat sink 502. A bottom side of each laser diode 510 is positioned on a different corresponding submount 520. The laser diodes 510 are electrically connected in series in the laser diode assembly 500.

Each laser diode 510 can be the laser diode 120 of FIG. 1. Each laser diode 510 can be for single-sided emission or for double-sided emission. As an example, three laser diodes 510 are illustrated in FIG. 5. However, a different number of laser diodes can be also included in the laser diode assembly 500. Each submount 520 can be electrically isolated or electrically conductive. Each submount 520 can be the submount 110 of FIG. 1. Each laser diode 510 can be mounted on the corresponding submount 520 via a first electrical contact pad 522a, 522b, 522c (referred to generally as first electrical contact pads 522 and individually as a first electrical contact pad 522). The first electrical contact pad 522 can be the electrical contact pad 112 of FIG. 1 and can be configured for eutectic bonding between the laser diode 510 and the submount 520.

Similar to the laser diodes 410 of FIG. 4 that are arranged at different heights along a vertical direction (e.g., along Y direction), the laser diodes 510 are also arranged at different heights along the vertical direction. Different from the first heat sink 402 and the second heat sink 404 of FIG. 4 that have flat mounting surfaces, the first heat sink 502 and the second heat sink 504 each have a staircase-like mounting surface. That is, each of the first heat sink 502 and the second heat sink 504 is a staircase-like substrate. The first heat sink 502 corresponds to the second heat sink 504.

As illustrated in FIG. 5, the first heat sink 502 includes a plurality of first steps consecutive to one another, and each submount 520 is positioned on a different corresponding first step of the first heat sink 502. The second heat sink 504 includes a plurality of second steps consecutive to one another, and a different corresponding second step of the plurality of second steps is on the top side of each laser diode 510. A height difference between adjacent first steps can be larger than a total height of the laser diode 510 and the submount 520. A height difference between adjacent second steps can be the same as the height difference between adjacent first steps. For each laser diode 510, mounting surfaces of the corresponding first step and the corresponding second step are substantially flat and parallel to each other.

The laser diode assembly 500 further includes a plurality of second electrical contact pads 508a, 508b, 508c, 508d (referred to generally as second electrical contact pads 508 and individually as a second electrical contact pad 508). Each second electrical contact pad 508 is on a different corresponding second step of the second heat sink 504 and in electrical contact with a first-type doped semiconductor layer of a corresponding laser diode 510 on which the different corresponding second step 510 is positioned. The second electrical contact pads 508 can be deposited on the second heat sink 504 by patterned metallization, e.g., with metal such as copper or copper tungsten.

Adjacent laser diodes 510 are electrically connected via the corresponding first electrical contact pad 522 and the corresponding second electrical contact pad 508. As the corresponding first electrical contact pad 522 and the corresponding second electrical contact pad 508 are at different heights along the vertical direction, the laser diode assembly 500 can include vertical electrical contact tabs 524a, 524b, 524c (referred to generally as electrical contact tabs 524 and individually as an electrical contact tab 524) electrically connected to the corresponding first electrical contact pad 522, and vertical electrical contact tabs 506b, 506c, 506d (referred to generally as electrical contact tabs 506 and individually as an electrical contact tab 506). Adjacent electrical contact tabs 524 and 506 are electrically connected. For example, as illustrated in FIG. 5, the adjacent laser diodes 510a, 510b are electrically connected via the first electrical contact pad 522a, the electrical contact tabs 524a, 506b, and the second electrical contact pad 508b. In such a way, the laser diodes 510 in the laser diode assembly 500 can be electrically connected in series along a horizontal direction, e.g., along X direction. The second electrical contact pads, e.g., 508a and 508d, at two ends of the second electrical contact pads can be separately coupled to a positive voltage (or current) and a negative voltage (or current) of a power source.

The laser diode assembly 500 can be fabricated by a fabrication process. In some implementations, the process includes: positioning each laser diode 510 of a plurality of laser diodes on a different corresponding first submount 520 of a plurality of submounts, a bottom side of the laser diode 510 being on the different corresponding submount 520, positioning the plurality of submounts 520 on a first heat sink 502, each first submount 520 being spaced apart from one another on the first heat sink 502, and positioning a second heat sink 504 on top sides of the plurality of laser diodes 510. The plurality of laser diodes 510 are electrically connected in series in the laser diode assembly.

The first heat sink 502 is a staircase-like substrate and includes a plurality of first steps consecutive to one another, and each of the plurality of submounts 520 is mounted on a respective first step of the plurality of first steps. The second heat sink 504 is a stair-case like substrate and corresponds to the first heat sink 502. The second heat sink 504 includes a plurality of second steps consecutive to one another. A height difference between adjacent second steps can be the same as a height difference between adjacent first steps. The top side of each of the plurality of laser diodes 510 is attached to a different corresponding second step of the plurality of second steps.

Each submount 520 can be electrically isolated. The process can include forming a plurality of first electrical contact pads 522 on the plurality of submounts 520. Each laser diode 510 is mounted on the corresponding submount 520 via a corresponding first electrical contact pad 522. The process can include forming a plurality of second electrical contact pads 508 on the second heat sink 504, e.g., by patterned metallization. The process can further include forming vertical electrical contact tabs 524, 506 for electrically connecting the first electrical contact pads 522 and the second electrical contact pads 508, such that the laser diodes 510 are electrically connected in series in the laser diode assembly 500.

FIGS. 6A-6C illustrate another system 600 for integrating single-sided emissions from multiple laser diodes in a laser diode assembly 630. The laser diode assembly 630 can be the laser diode assembly 400 of FIG. 4 or the laser diode assembly 500 of FIG. 5. The laser diodes in the laser diode assembly 630 are at different heights along a vertical direction (e.g., Y direction). The system 600 is configured to combine laser light beams emitted from the laser diodes at different heights into a single fiber 620 (e.g., the single fiber 220 of FIG. 2A) having an end cap 622 (e.g., the end cap 222 of FIG. 2A).

As illustrated in FIG. 6B, the laser diode assembly 630 includes a plurality of laser diodes 610a, 610b, 610c (referred to generally as laser diodes 610 and individually as a laser diode 610) positioned at different heights along the vertical direction. In some examples, each laser diode 610 can be the laser diode 410 of FIG. 4 and be mounted on a submount (e.g., the submount 420 of FIG. 4) of a plurality of submounts having different heights, and the submounts are positioned on a flat substrate, e.g., the heat sink 402 of FIG. 4. In some examples, each laser diode 610 can be the laser diode 510 of FIG. 5 and be mounted on a corresponding submount (e.g., the submount 520 of FIG. 5) positioned on different steps of a staircase-like substrate, e.g., the heat sink 502 of FIG. 5.

Each laser diode 610 is configured to emit a corresponding laser light beam 611a, 611b, 611c (referred to generally as light beams 611 and individually as a light beam 611) from a single facet, e.g., a front facet of the laser diode 610. That is, the laser diode 610 is for single-sided emission. In some implementations, the laser diodes 610 are double-sided cooled with two heat sinks, e.g., the first and second heat sinks 402 and 406 of FIG. 4 or the first and second heat sinks 502 and 504 of FIG. 5, positioned on top and bottom sides of the laser diodes 610.

The light beam 611a, 611b, 611c from each laser diode 610a, 610b, 610c propagates through a first optical component 602a, 602b, or 602c (referred to a first optical component 602) and a second optical component 604a, 604b, or 604c (referred to a second optical component 604) for beam shaping and is then individually redirected by a corresponding redirecting mirror 606a, 606b, 606c (referred to generally as redirecting mirrors 606 and individually as a redirecting mirror 606). In some implementations, the first component 602 includes a Fast-Axis Collimating (FAC) lens configured to collimate the light beam 611 from the laser diode 610 along the fast axis of the light beam 611. The second component 604 includes a Slow Axis Collimator (SAC) lens configured to collimate the light beam 611 along the slow axis of the light beam 611. The redirecting mirrors 606 can be configured such that the collimated light beams 611a, 611b, 611c are spaced in parallel and stacked along a direction such as along Y direction, as illustrated in FIG. 6B. The staircase-like submounts or heat sinks enable the light beams 611a, 611b, 611c to propagate along a same direction (e.g., X direction) without obstruction.

The collimated light beams 611a, 611b, 611c are directed by another redirecting mirror 608 and focused by a focusing component 609 (e.g., an optical lens) to be coupled into the fiber 620 through the end cap 622. As illustrated in FIG. 6C, focused beam spots 613a, 613b, 613c of the light beams 611a, 611b, 611c can be vertically stacked along the fast axis (e.g., Y direction) on a cross section 621 of the fiber 620 for generating a high power.

Figures 7A, 7B:
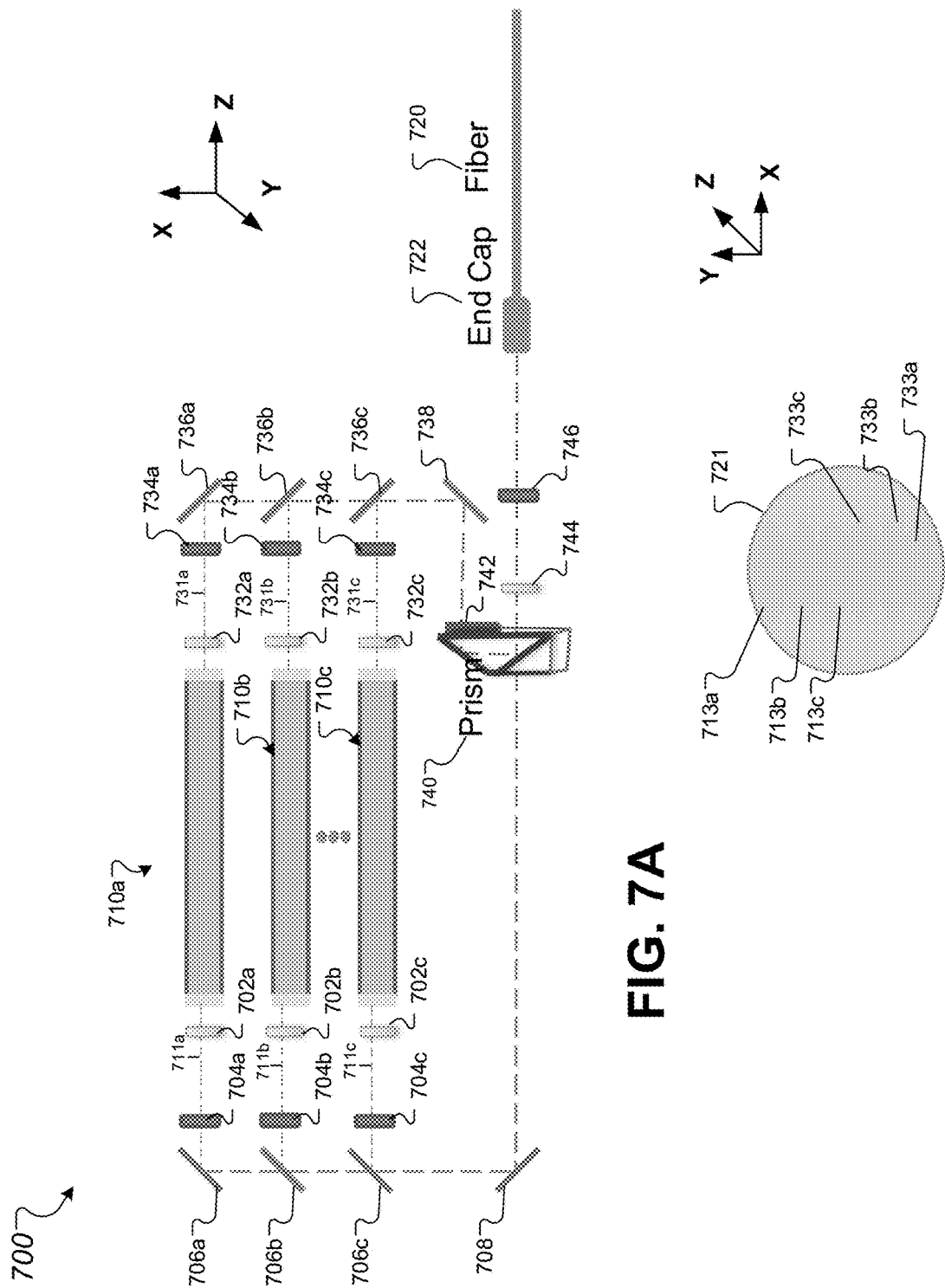
FIG. 7A is a schematic illustrating another system for integrating double-sided emissions from multiple laser diodes in a laser diode assembly.
FIG. 7B is a schematic illustrating aligned multiple laser emission spots from the laser diode assembly in the system of FIG. 7A.

FIGS. 7A-7B illustrate another system 700 for integrating double-sided emissions from multiple laser diodes in a laser diode assembly. The laser diode assembly can be the laser diode assembly 400 of FIG. 4 or the laser diode assembly 500 of FIG. 5. The laser diodes are at different heights along a vertical direction (e.g., Y direction) in the laser diode assembly. The system 600 is configured to combine laser light beams emitted from the laser diodes at different heights into a single fiber 720 (e.g., the single fiber 220 of FIG. 2A) having an end cap 722 (e.g., the end cap 222 of FIG. 2A).

Similar to the laser diodes 610 of FIGS. 6A-6B, laser diodes 710a, 710b, 710c (referred to generally as laser diodes 710 and individually as a laser diode 710) are at different heights along Y direction. In some examples, each laser diode 710 is the laser diode 410 of FIG. 4 and can be mounted on a submount (e.g., the submount 420 of FIG. 4) of a plurality of submounts having different heights and being positioned on a flat substrate, e.g., the heat sink 402 of FIG. 4. In some examples, each laser diode 710 can be the laser diode 510 of FIG. 5 and be mounted on a corresponding submount (e.g., the submount 520 of FIG. 5) positioned on a different step of a staircase-like substrate, e.g., the heat sink 502 of FIG. 5. In some implementations, the laser diodes 710 are double-sided cooled with two heat sinks, e.g., the first and second heat sinks 402 and 406 of FIG. 4 or the first and second heat sinks 502 and 504 of FIG. 5, positioned on top and bottom sides of the laser diodes 710.

Different from the laser diodes 610 of FIGS. 6A-6B with single-sided emission, the laser diodes 710 are for double-sided emission and configured to emit laser light beams from both front and rear facets. As illustrated in FIG. 7A, each laser diode 710a, 710b, 710c emits a first light beam 711a, 711b, 711c (referred to generally as first light beams 711 and individually as a first light beam 711) from the front facet at different vertical heights, and a second light beam 731a, 731b, 731c (referred to generally as second light beams 731 and individually as a second light beam 731) at different vertical heights.

The system 700 is configured to integrate the first light beams 711 from the front facets of the laser diodes 710 and the second light beams 731 from the back facets of the laser diodes 710 together onto the end cap 722 of the fiber 720. As illustrated in FIG. 7A, each first light beam 711a, 711b, 711c propagates through a first optical component 702a, 702b, 702c (e.g., the first optical component 602 of FIG. 6A such as an FAC lens) and a second optical component 704a, 704b, 704c (e.g., the second optical component 604 of FIG. 6A such as a SAC lens) and is reflected by a first redirecting mirror 706a, 706b, 706c (e.g., the redirecting mirror 606 of FIG. 6A) onto a first surface of an optical combiner 740 (e.g., an optical prism).

Each second light beam 731a, 731b, 731c propagates through another first optical component 732a, 732b, 732c (e.g., the first optical component 602 of FIG. 6A such as an FAC lens) and another second optical component 634a, 634b, 634c (e.g., the second optical component 604 of FIG. 6A such as an SAC lens) and is reflected by a second redirecting mirror 736a, 736b, 736c (e.g., the redirecting mirror 606 of FIG. 6A) onto a second surface of the optical combiner 740 via another redirecting mirror 738. In some implementations, an optical retarder 742 (e.g., the optical retarder 352 of FIG. 3) is arranged on the second surface of the prism 740 and configured to adjust a polarization state of the second light beams 731. The optical combiner 740 can be configured to redirect the first light beams 711 and the second light beams 731 along a same direction (such as Z direction) towards the end cap 722 of the fiber 720 and to be stacked and spaced along Y direction. A focusing component 744 (e.g., the focusing component 609 of FIG. 6A) is configured to focus the first light beams 711 and the second light beams 731 onto the end cap 722. An optical retarder 746 (e.g., the optical retarder 208 of FIG. 2A) can be arranged between the focusing component 744 and the end cap 722 and configured to adjust a polarization state of the focused first light beams 711 and the focused second light beams 731. As illustrated in FIG. 7B, focused beam spots 713a, 713b, 713c of the first light beams 711a, 711b, 711c and focused beam spots 733a, 733b, 733c of the second light beams 731a, 731b, 731c can be vertically stacked along the fast axis (e.g., Y direction) on a cross section 721 of the fiber 720 for generating a high power.

A number of embodiments of the invention have been described. Nevertheless, it will be understood that various modifications may be made without departing from the spirit and scope of the invention. Accordingly, other embodiments are within the scope of the following claims.

What is claimed is:

1. A laser diode assembly comprising:
a first heat sink extending along a horizontal direction;
a plurality of submounts spaced apart from one another on the first heat sink along the horizontal direction;
a plurality of laser diodes, each laser diode comprising a corresponding active layer between a first-type doped semiconductor layer and a second-type doped semiconductor layer, a bottom side of each laser diode being positioned on a different corresponding submount of the plurality of submounts along a vertical direction perpendicular to the horizontal direction, the plurality of laser diode being electrically connected in series;
a second heat sink on top sides of the plurality of laser diodes;
a plurality of first electrical contact pads positioned on the second heat sink along the vertical direction and spaced from one another along the horizontal direction;
a plurality of second electrical contact pads positioned on top of the plurality of submounts along the vertical direction; and
a plurality of vertical electrical contacts positioned on top of the plurality of second electrical contact pads along the vertical direction,
wherein, for each of the plurality of submounts, a corresponding laser diode and a corresponding vertical electrical contact are separately positioned on a top surface of a corresponding second electrical contact pad that is parallel to the horizontal direction.

2. The laser diode assembly of claim 1, wherein each first electrical contact pad is positioned on the top side of a first corresponding laser diode and in electrical contact with a first-type doped semiconductor layer of the first corresponding laser diode, at least one first electrical contact pad providing a serial electrical connection between adjacent laser diodes.

3. The laser diode assembly of claim 1, wherein each second electrical contact pad is positioned on a different corresponding submount and in electrical contact with a second-type doped semiconductor layer of a second corresponding laser diode whose bottom side is positioned on the second electrical contact pad.

4. The laser diode assembly of claim 3, each vertical electrical contact is configured to provide a direct electrical connection between a corresponding first electrical contact pad and a corresponding second electrical contact pad.

5. The laser diode assembly of claim 1, wherein the plurality of vertical electrical contacts and the plurality of laser diodes form a plurality of pairs, each pair being provided on a different corresponding submount and comprising a different corresponding laser diode and a different corresponding vertical electrical contact.

6. The laser diode assembly of claim 5, wherein, for each pair of the plurality of pairs, the different corresponding laser diode is spaced apart from the different corresponding vertical electrical contact on the different corresponding submount with a first gap,
wherein adjacent first electrical contact pads are spaced apart from one another on the second heat sink with a second gap, the second gap having a same width as the first gap, and
wherein the plurality of first electrical contact pads are aligned with the plurality of pairs, such that each second gap is aligned with a different corresponding first gap.

7. The laser diode assembly of claim 5, wherein at least one of the plurality of first electrical contact pads provides a direct electrical connection between a first vertical electrical contact in a first pair and the first-type doped semiconductor layer of a second laser diode in a second pair adjacent to the first pair.

8. The laser diode assembly of claim 1, wherein each vertical electrical contact comprises a second-type doped semiconductor material.

9. The laser diode assembly of claim 1, wherein the laser diode comprises a first facet and a second facet opposite to the first facet, the first facet and the second facet being parallel to each other, and
wherein the laser diode is configured to emit light from at least one of the first facet or the second facet.

10. A laser diode assembly comprising:
a first heat sink extending along a horizontal direction;
a plurality of first submounts spaced apart from one another on the first heat sink along the horizontal direction;
a plurality of laser diodes, each laser diode comprising a corresponding active layer between a first-type doped semiconductor layer and a second-type doped semiconductor layer, a bottom side of each laser diode being positioned on a different corresponding submount of the plurality of submounts, the plurality of laser diode being electrically connected in series;
a second heat sink on top sides of the plurality of laser diodes;
a plurality of second submounts spaced apart from one another along the horizontal direction, wherein each laser diode of the plurality of laser diodes is positioned along a vertical direction between a different corresponding first submount and a different corresponding second submount of the plurality of second submounts, the vertical direction being perpendicular to the horizontal direction, direction, wherein a vertical thickness along the vertical direction of the different corresponding first submount and a vertical thickness along the vertical direction of the different corresponding second submount are different from one another, wherein the second heat sink is positioned on top of the plurality of second submounts, and wherein each first submount and each second submount comprise an electrically conductive material;
a plurality of first electrical contact pads on the first heat sink along the vertical direction, at least one first electrical contact pad providing a first serial electrical connection between first adjacent laser diodes through corresponding adjacent first submounts, each of the at least one first electrical contact pad being in direct contact with bottom surfaces of two corresponding adjacent first submounts; and a plurality of second electrical contact pads on the second heat sink along the vertical direction, at least one second electrical contact pad providing a second serial electrical connection between second adjacent laser diodes through corresponding adjacent second submounts, each of the at least one second electrical contact pad being in direct contact with top surfaces of two corresponding adjacent second submounts that are parallel to the bottom surfaces of the two corresponding adjacent first submounts.

11. The laser diode assembly of claim 10, wherein, along the vertical direction, a bottom surface of the bottom side of each laser diode is on a top surface of the different corresponding first submount, and a bottom surface of the different corresponding second submount is on a top surface of the top side of the laser diode, and wherein bottom surfaces of the different corresponding first submounts are on a top surface of the first heat sink, and a bottom surface of the second heat sink is on top surfaces of the different corresponding second submounts.

12. The laser diode assembly of claim 11, wherein the top surface of the first heat sink and the bottom surface of the second heat sink are flat and parallel to each other, and wherein a vertical distance between the corresponding active layer of each laser diode and the top surface of the first heat sink along the vertical direction is different from each other.

13. The laser diode assembly of claim 12, wherein, for each laser diode of the plurality of laser diodes, a vertical distance between the bottom surface of the different corresponding second submount and the top surface of the different corresponding first submount along the vertical direction is identical to each other, and wherein each laser diode of the plurality of laser diodes has an identical vertical thickness along the vertical direction, and vertical thicknesses of the different corresponding second submounts along the vertical direction are different from one another, and vertical thicknesses of the different corresponding first submounts along the vertical direction are different from one another.

14. The laser diode assembly of claim 10, wherein the laser diode comprises a first facet and a second facet opposite to the first facet, the first facet and the second facet being parallel to each other, and wherein the laser diode is configured to emit light from at least one of the first facet or the second facet.

15. A method of fabricating a laser diode assembly, the method comprising:

positioning each laser diode of a plurality of laser diodes on a different corresponding submount of a plurality of submounts, each laser diode comprising a corresponding active layer between a first-type doped semiconductor layer and a second-type doped semiconductor layer, a bottom side of the laser diode being on the different corresponding submount;

positioning the plurality of submounts on a first heat sink, each submount of the plurality of submounts being spaced apart from one another on the first heat sink along a horizontal direction;

positioning a second heat sink on top sides of the plurality of laser diodes;

forming a plurality of first electrical contact pads on the second heat sink;

forming a plurality of second electrical contact pads on the plurality of submounts; and forming a plurality of vertical electrical contacts on the plurality of second electrical contact pads, wherein, for each of the plurality of submounts, a corresponding laser diode and a corresponding vertical electrical contact are separately positioned on a top surface of a corresponding second electrical contact pad that is parallel to the horizontal direction.

16. The method of claim 15, wherein each first electrical contact pad is positioned on a top side of a first corresponding laser diode and in electrical contact with a first-type doped semiconductor layer of the first corresponding laser diode, at least one first electrical contact pad providing a serial electrical connection between adjacent laser diodes, wherein each second electrical contact pad is formed on a different corresponding submount and in electrical contact with a second-type doped semiconductor layer of a second corresponding laser diode whose bottom side is positioned on the second electrical contact pad, and wherein each vertical electrical contact is on a different corresponding second electrical contact pad and spaced apart from the corresponding laser diode on the different corresponding second electrical contact pad by a corresponding first gap.

17. The method of claim 16, wherein adjacent first electrical contact pads are spaced apart from one another on the second heat sink with a corresponding second gap, the corresponding second gap having a same width as the corresponding first gap, and wherein positioning a second heat sink on top sides of the plurality of laser diodes comprises:

inserting a plurality of spacers into the corresponding first gaps; and arranging the plurality of spacers into the corresponding second gaps of the plurality of first electrical contact pads, such that each first electrical contact pad provides an electrical connection between a vertical electrical contact corresponding to a first laser diode and the first-type doped semiconductor layer of a second laser diode adjacent to the first laser diode.

18. The method of claim 15, wherein the laser diode comprises a first facet and a second facet opposite to the first facet, the first facet and the second facet being parallel to each other, and wherein the laser diode is configured to emit light from at least one of the first facet or the second facet.

* * * * *